(12) United States Patent
Bogi et al.

(10) Patent No.: US 11,495,955 B2
(45) Date of Patent: Nov. 8, 2022

(54) RECTIFIER TRIGGERING TECHNIQUES

(71) Applicant: Arm Limited, Cambridge (GB)

(72) Inventors: Seshagiri Rao Bogi, Bangalore (IN); Fabrice Blanc, Vinay (FR)

(73) Assignee: Arm Limited, Cambridge (GB)

( * ) Notice: Subject to any disclaimer, the term of this patent is extended or adjusted under 35 U.S.C. 154(b) by 20 days.

(21) Appl. No.: 16/785,513

(22) Filed: Feb. 7, 2020

(65) Prior Publication Data
US 2021/0249849 A1  Aug. 12, 2021

(51) Int. Cl.
*H02H 9/02* (2006.01)
*H02H 1/00* (2006.01)
*H01L 27/02* (2006.01)
*H02H 9/04* (2006.01)
*H05K 13/00* (2006.01)

(52) U.S. Cl.
CPC ....... *H02H 1/0007* (2013.01); *H01L 27/0262* (2013.01); *H02H 9/02* (2013.01); *H02H 9/046* (2013.01); *H02H 9/04* (2013.01); *H05K 13/00* (2013.01)

(58) Field of Classification Search
CPC ........ H02H 9/046; H02H 1/0007; H02H 9/04; H02H 9/02; H01L 27/0262; H01L 27/0255; H01L 27/0288; H01L 27/0292; H01L 27/02; H05K 13/00; G06F 17/50
USPC .......................................... 361/56, 91.1, 111
See application file for complete search history.

(56) References Cited

U.S. PATENT DOCUMENTS

| | | | | |
|---|---|---|---|---|
| 2003/0234425 A1* | 12/2003 | Chiu | .................. | H01L 27/0251 257/355 |
| 2005/0057866 A1* | 3/2005 | Mergens | ............ | H03K 17/0814 361/56 |
| 2012/0257317 A1* | 10/2012 | Abou-Khalil | ....... | H01L 27/0262 361/56 |
| 2016/0372921 A1* | 12/2016 | Lai | ......................... | H02H 9/046 |

* cited by examiner

*Primary Examiner* — Danny Nguyen
(74) *Attorney, Agent, or Firm* — Pramudji Law Group PLLC; Ari Pramudji

(57) ABSTRACT

Various implementations described herein are related to a device having switching circuitry that provides a rectified voltage when triggered. The device may include diode circuitry coupled in series with charge storage circuitry. The diode circuitry and the charge storage circuitry may operate to trigger the switching circuitry. The diode circuitry may include one or more diodes, and the charge storage circuitry may include at least one charge storage component.

20 Claims, 6 Drawing Sheets

RECTIFIER TRIGGERING TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some electronic architectures, electro-static discharge (ESD) may refer to a surge of electricity between electrically-charged components in an integrated circuit (IC). In some scenarios, ESD may occur by electrical contact, which may cause ESD induced defects (e.g., electrical shorts, dielectric breakdown, etc.). Small-scale ESD events may induce damage to highly-sensitive electronic components and devices, which may suffer permanent damage when subjected to errant ESD current and/or voltage surges. In response to ESD, electronic device designers and manufacturers have attempted to establish specific protection circuitry in ICs and electro-static protective practices along various manufacturing steps. As such, conventional ESD protection circuitry could be optimized or tuned for specific technologies and design constraints. Unfortunately, ESD protection devices (with ESD triggering voltage and holding voltage) measures can be relatively ineffective when working far from operating voltage levels. Thus, there exists a need to improve layout and design of ESD protective circuits.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to rectifier triggering schemes and techniques. For instance, the various schemes and techniques described herein may provide for a capacitor-coupled (CC) diode-triggered (DT) silicon-controlled rectifier (SCR) that effectively implements an optimized triggering circuit that makes the SCR an efficient electro-static discharge (ESD) protection device to support and protect integrated circuits (ICs) at chip level from ESD surges. In some implementations, the CC-DT-SCR may have favorable area and leakage benefits along with less sensitivity to false triggering under excessive noise and Latch-Up (LU) injection. Various implementations described herein may provide various useful triggering schemes and techniques for increasing immunity to various noise and Latch-Up (LU) conditions while keeping its ESD performance.

Various implementations of rectifier triggering schemes and techniques will be described in detail herein with reference to FIGS. 1A-5.

Figure 1A:
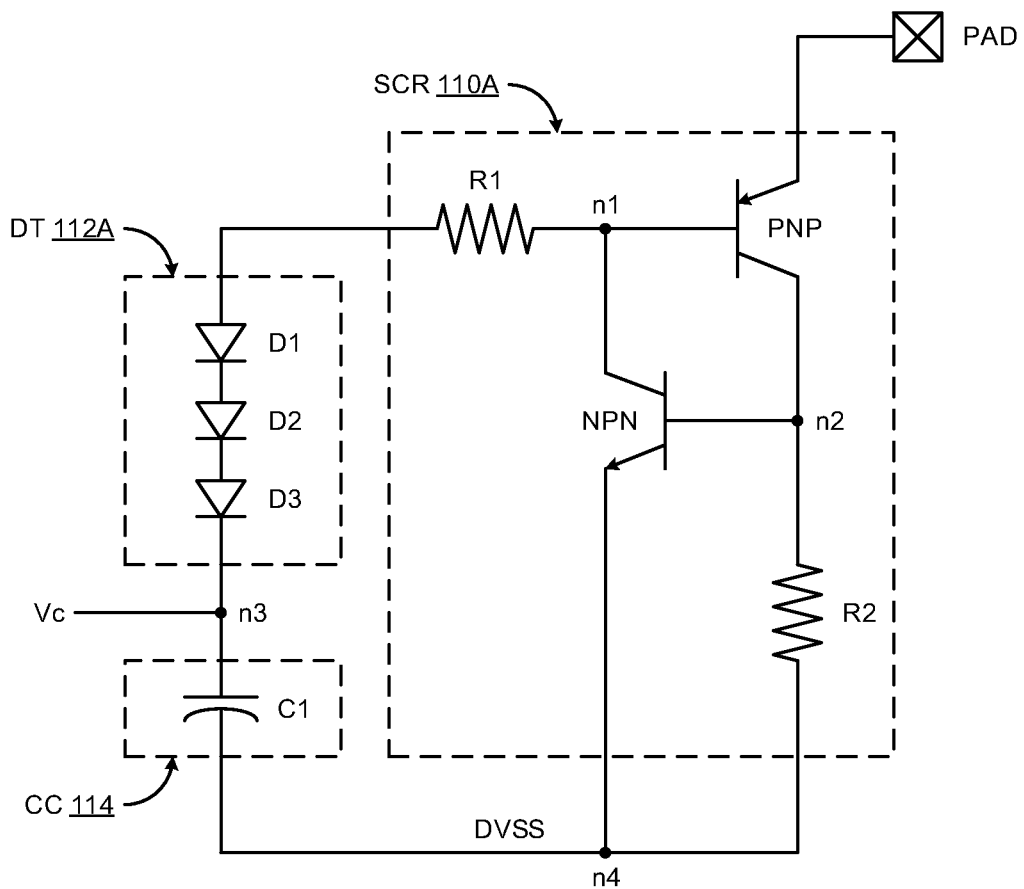
FIGS. 1A-1B illustrate various diagrams of rectifier circuitry in accordance with various implementations described herein.
Figure 1B:
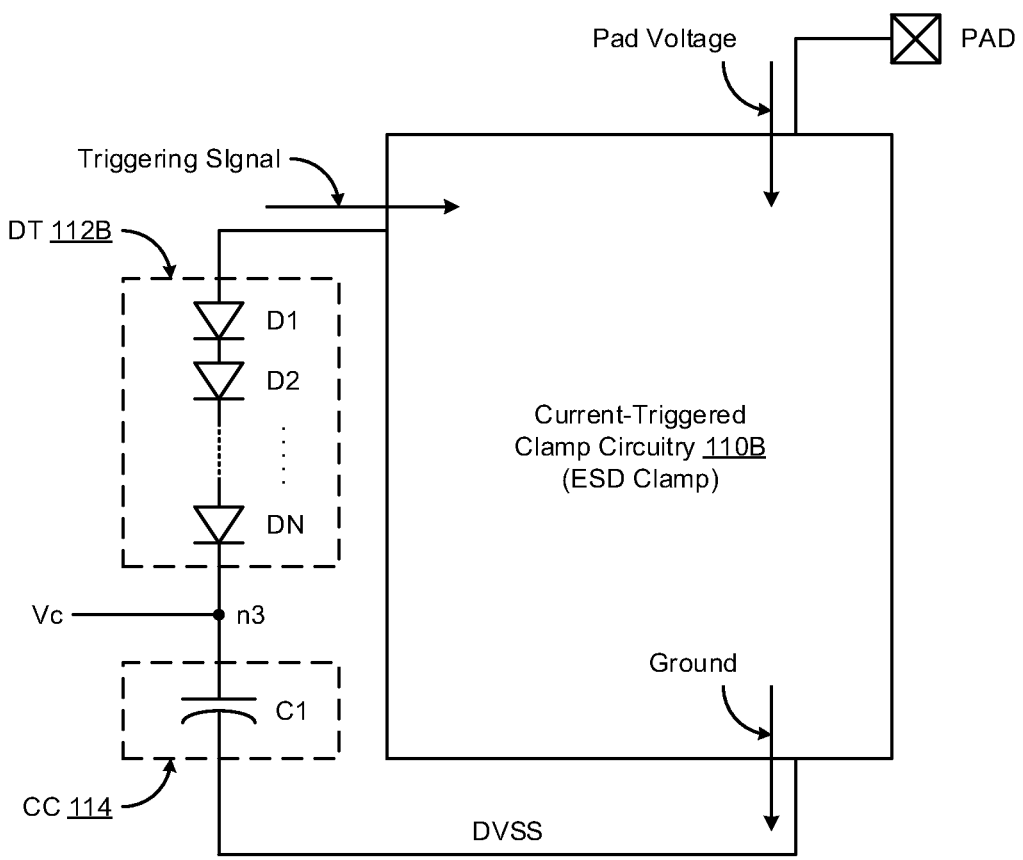

FIGS. 1A-1B illustrate various diagrams of rectifier circuitry 102 in accordance with various implementations described herein. In particular, FIG. 1A shows a diagram 100A of rectifier circuitry 102A having silicon-controlled rectifier (SCR) circuitry 110A, and also, FIG. 1B shows another diagram 100B of clamp circuitry 102B having current-triggered clamp (CTC) circuitry 110B. The SCR 110A and the CTC 110B may be implemented with various types of switching configurations that provide a rectified voltage when triggered by a diode-capacitor structure (DT/CC).

In various implementations, the rectifier circuitry 102 may be implemented as a system or a device having various integrated circuit (IC) components that are arranged and coupled together as an assemblage or combination of parts that provide for a physical circuit design and related structures. In some instances, a method of designing, providing and building the rectifier circuitry 102 as an integrated system or device may involve use of various IC circuit components described herein so as to implement various rectifier triggering schemes and techniques associated therewith. Also, the rectifier circuitry 102 may be integrated with computing circuitry and related components on a single chip, and the rectifier circuitry 102 may be implemented in embedded systems for electronic, mobile and Internet-of-things (IoT) applications, including sensor nodes.

In various implementations, the rectifier circuitry 102 may be used to improve electro-static discharge (ESD) protection with an improved triggering circuit, which offers lower triggering voltage under ESD, while keeping a high immunity for false triggering by having a higher triggering voltage when IC power in ON. Thus, the rectifier circuitry 102 may be referred to as rectifier triggering circuitry having a rectifier (or a thyristor) exposed to a pad voltage provided at a pad (PAD). In various instances, the rectifier (or thyristor) may be implemented with any type of switching circuitry that is controlled by a triggering current. Further, the rectifier may be referred to as a triggered rectifier having any type of current-triggered clamping circuit that may be used as a switching structure.

Also, in some implementations, the rectifier circuitry 102 may be referred to as capacitor coupled (CC) diode triggered (DT) silicon-controlled rectifier (SCR) circuitry that may be utilized for electro-static discharge (ESD) protection. The SCR may be referred to as a thyristor having a PNPN structure with interlaced PNP and NPN devices. Also, ESD protection should be invisible during normal IC operation, and the CC-DT-SCR may operate to sink ESD current through a substantially low impedance so as to minimize any voltage build-up during an ESD event. Thus, the CC-DT-SCR may operate to "rectify" the voltage built-up under an ESD condition, and the CC-DT-SCR may not be interacting with external circuitry during normal operating conditions. In any event, by incorporating the coupling capacitor (CC/C1) into the triggering circuit path (diode+capacitor), the CC-DT-SCR may allow for improved ESD protection efficiency along with optimized low triggering voltages, while increasing the triggering voltage when power is active or on. Thus, during normal operating conditions, and in case of voltage overshoots that occur under some test conditions, the CC-DT-SCR may offer improved immunity to false triggering.

As shown in FIG. 1A, the rectifier circuitry 102A includes switching circuitry 110A that provides a rectified voltage when triggered along with a long ohmic path when triggered. Also, the rectifier circuitry 102 may include diode circuitry (DT) 112A coupled in series with charge storage circuitry (CC) 114 that may operate to trigger the switching circuitry 110A. In various implementations, the rectifier circuitry 102 may refer to any type of switching circuit, such as, e.g., a rectifier or a thyristor, that is adapted to provide for electro-static discharge (ESD) protection.

In some instances, the switching circuitry (SCR) 110A may be coupled to a pad (PAD) and thereby exposed to a pad voltage, wherein the switching circuitry (SCR) 110A may be configured to limit voltage applied to the rectified voltage when triggered by the diode circuitry (DT) 112A. As shown in FIG. 1A, the switching circuitry (SCR) 110A may be implemented as a silicon-controlled rectifier (SCR) having one or more bipolar junction transistors (BJTs). In some implementations, the BJTs may include a first BJT (PNP) and a second BJT (NPN), wherein the first BJT (PNP) may refer to a PNP based BJT, and the second BJT (NPN) may refer to an NPN based BJT. The base terminal of the first BJT (PNP) may be coupled to a first resistor (R1) at node (n1), and the first BJT (PNP) may be coupled between the pad (PAD) and a second resistor (R2) at node (n2). The base terminal of the second BJT (NPN) may be coupled to node (n2), and also, the second BJT (NPN) may be coupled between node (n1) and ground (DVSS) at node (n4). The resistors R1 and R2 may not be actual resistors, and as such, R1 and R2 may refer to the intrinsic parasitic resistance of the WELLs layer that provide access to the internal n1 and n2 nets within the SCR structure. As described herein below in reference to FIG. 1B, the rectifier circuitry 102 may be implemented with various types of switching configurations that may provide a rectified voltage when triggered by the diode-capacitor structure of the diodes 112A and the capacitor 114.

In some instances, the diode circuitry (DT) 112A may refer to diode triggering (DT) circuitry having one or more diodes (e.g., D1, D2, D3) that are coupled together in series between the switching circuitry (SCR) 110A and the charge storage circuitry (CC) 114. As shown in FIG. 1A, the diode triggering circuitry (DT) 112A may include any number of diodes, such as, e.g., a first diode (D1), a second diode (D2), and a third diode (D3), that are coupled in series between net n1 with resistor (R1) and the charge storage circuitry (CC) 114 at node (n3). The number of diodes may be adjusted (or tuned) to an expected triggering voltage, which may be less than or greater than the number of diodes shown in FIGS. 1A-1B. Also, the charge storage circuitry (CC) 114 may include one or more capacitors (e.g., C1) that may be referred to as a coupling capacitor (CC), which is coupled between the diode circuitry (DT) 112A and ground (DVSS) at node (n4). As described herein below in reference to FIGS. 2-4, the coupling capacitor (CC/C1) 114 may be biased with a control voltage (Vc) that may be provided with discharge control circuitry. In this instance, the rectifier circuitry 102 may include discharge control circuitry that is coupled to node (n3) disposed between the diode circuitry (DT) 112A and the charge storage circuitry (CC/C1) 114, and also, the discharge control circuitry may be configured to bias the charge storage circuitry (CC/C1) 114 under standard (or normal) operating conditions and to discharge stored voltage in the capacitor (C1) in power off mode and in between multiple electro-static discharges (ESD).

As described herein, the rectifier circuitry 102A may be configured to operate as a triggered rectifier having a first stage with SCR 110A that provides a rectified voltage when triggered. The rectifier circuitry 102A includes a second stage with multiple diodes (D1, D2, D3) and the capacitor (C1) that trigger the SCR 110A by pulling the diode and capacitor current from the SCR 110A. In some instances, as shown in FIG. 1A, the didoes (D1, D2, D3) along with the capacitor (C1) may be configured to form a triggering branch (i.e., diode+capacitor) that is coupled to the PNP base terminal of the first BJT (PNP) of the SCR 110A. Therefore, this diode-capacitor triggering branch may be coupled to the gating terminals of the SCR 110A to thereby trigger the SCR 102A.

In some instances, the rectifier circuitry 102A may include one or more resistors including, e.g., the first resistor (R1) and the second resistor (R2), wherein the first resistor (R1) is coupled between the diode circuitry (DT) 112A and the switching circuitry (SCR) 110A at node (n1), and the second resistor (R2) is coupled between the switching circuitry (SCR) 110A at node (n2) and ground (DVSS). In some instances, the resistors (R1, R2) may be native resistors that are built-in within the SCR structure, e.g., as parasitic well-resistors, for accessing the parasitic terminals of the BJT devices (PNP, NPN) to thereby form a thyristor structure, which may be referred to as the SCR.

FIG. 1B shows diagram 100B of the rectifier circuitry 102B having the current-triggered clamp (CTC) circuitry 110B as another type of triggered rectifier. The rectifier circuitry 102B of FIG. 1B may have similar components with similar scope and features along with similar operational behaviors and characteristics as the rectifier circuitry 102A in FIG. 1A. In this instance, the CTC 110B may operate as an ESD clamp.

As shown in FIG. 1B, the switching circuitry (CTC) 110B may be implemented as rectifier (or thyristor) having various logic devices that are arranged and configured to provide a current-triggered clamp. As such, the switching circuitry (CTC) 110B may refer to a current-triggered clamping circuit that receives a pad voltage from the pad (PAD) and provides the rectified voltage when triggered by a triggering signal from the diode circuitry (DT) 112B with a number (N) of diodes (D1, D2, . . . , DN). In some instances, the diodes (D1, D2, . . . , DN) may be coupled in series between the switching circuitry (CTC) 110B and the capacitor circuitry (CC) 114, which includes at least one capacitor (C1) coupled between the diodes (D1, D2, . . . , DN) and ground (DVSS).

In some implementations, the switching circuitry (CTC) 110B may be coupled to the pad (PAD) and exposed to the pad voltage, and the switching circuitry (CTC) 110B may be configured to limit voltage applied to the rectified voltage when triggered by the diodes (D1, D2, . . . , DN). As shown in FIG. 1B, the CTC 110B may be coupled to a first diode (D1) in the diode stack, and also, the coupling capacitor (CC/C1) may be coupled to a last diode (DN) in the diode stack at node (n3). Also, as described herein, the rectifier circuitry 102, 102B may be implemented with various types of switching configurations that provide rectified voltage when triggered by the diode-capacitor structure of the diodes (D1, D2, . . . , DN) and the coupling capacitor (CC/C1).

As described herein, the rectifier circuitry 102B may be configured to operate as a triggered rectifier having a first stage with CTC 110B that provides a rectified voltage when triggered. The rectifier circuitry 102B includes a second stage with multiple diodes (D1, D2, . . . , DN) and capacitor (CC/C1) that trigger the CTC 110B by pulling the diode and capacitor current from the CTC 110B. In some instances, as shown in FIG. 1B, the didoes (D1, D2, . . . , DN) along with the coupling capacitor (CC/C1) are configured to form a triggering branch (i.e., diode+capacitor) that is coupled to the CTC 110B. Therefore, this diode-capacitor triggering branch may be coupled to the gating terminals of the CTC 110B to thereby trigger the CTC 110B during an ESD event.

As described herein below in reference to FIGS. 2-4, the coupling capacitor (CC/C1) 114 may be biased with the control voltage (Vc) that is provided with discharge control circuitry. In this instance, the rectifier circuitry 102B may include discharge control circuitry that is coupled to node (n3) disposed between the diode circuitry (DT) 112B and the capacitor (CC/C1) 114, and also, the discharge control circuitry may be configured to bias the capacitor (CC/C1) 114 under standard operating conditions and discharge stored voltage in the capacitor (C1) in power off mode and in between multiple electro-static discharge (ESD).

Figure 2:
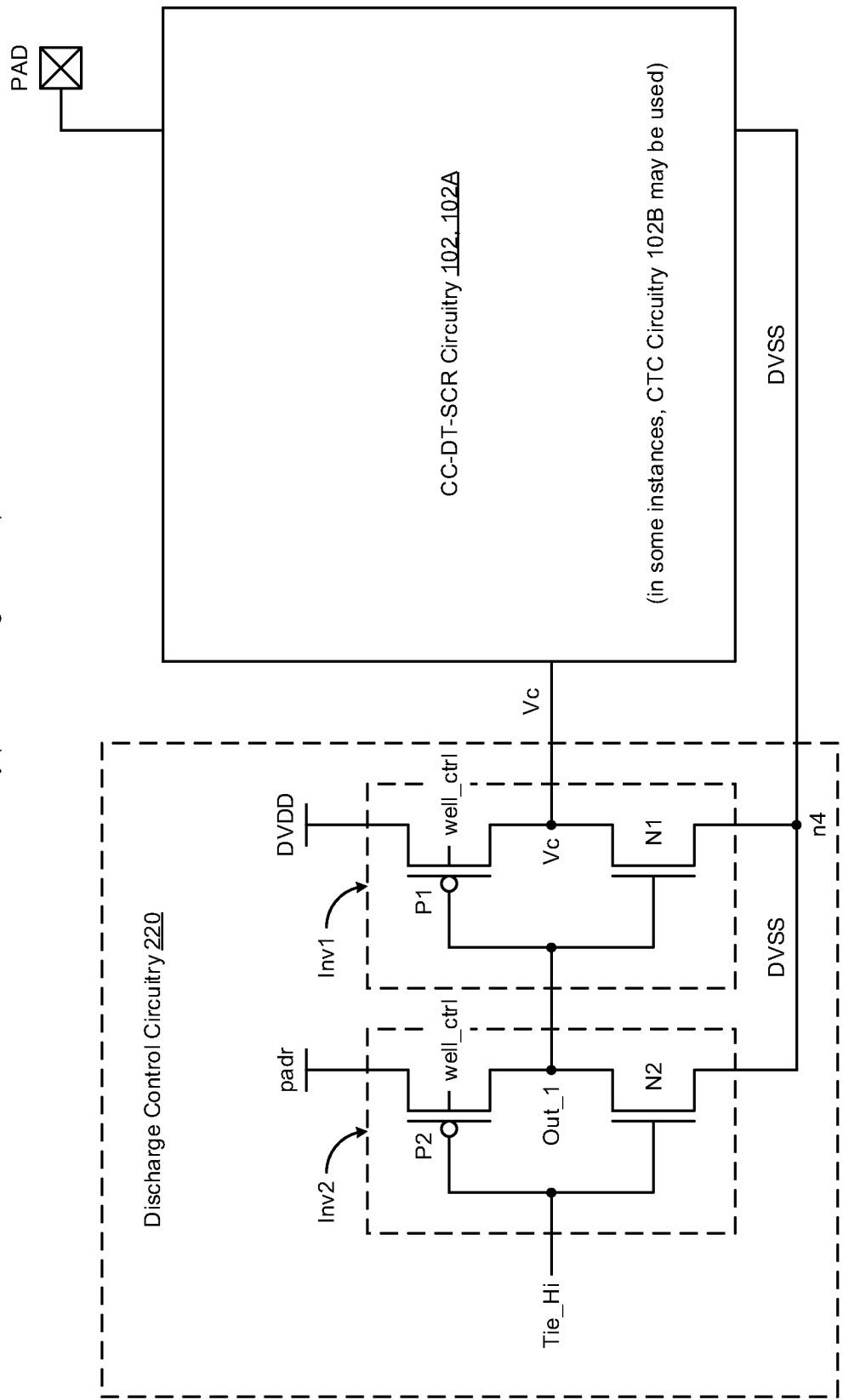
FIGS. 2-4 illustrate various diagrams of rectifier circuitry with discharge control in accordance with various implementations described herein.
Figure 3:
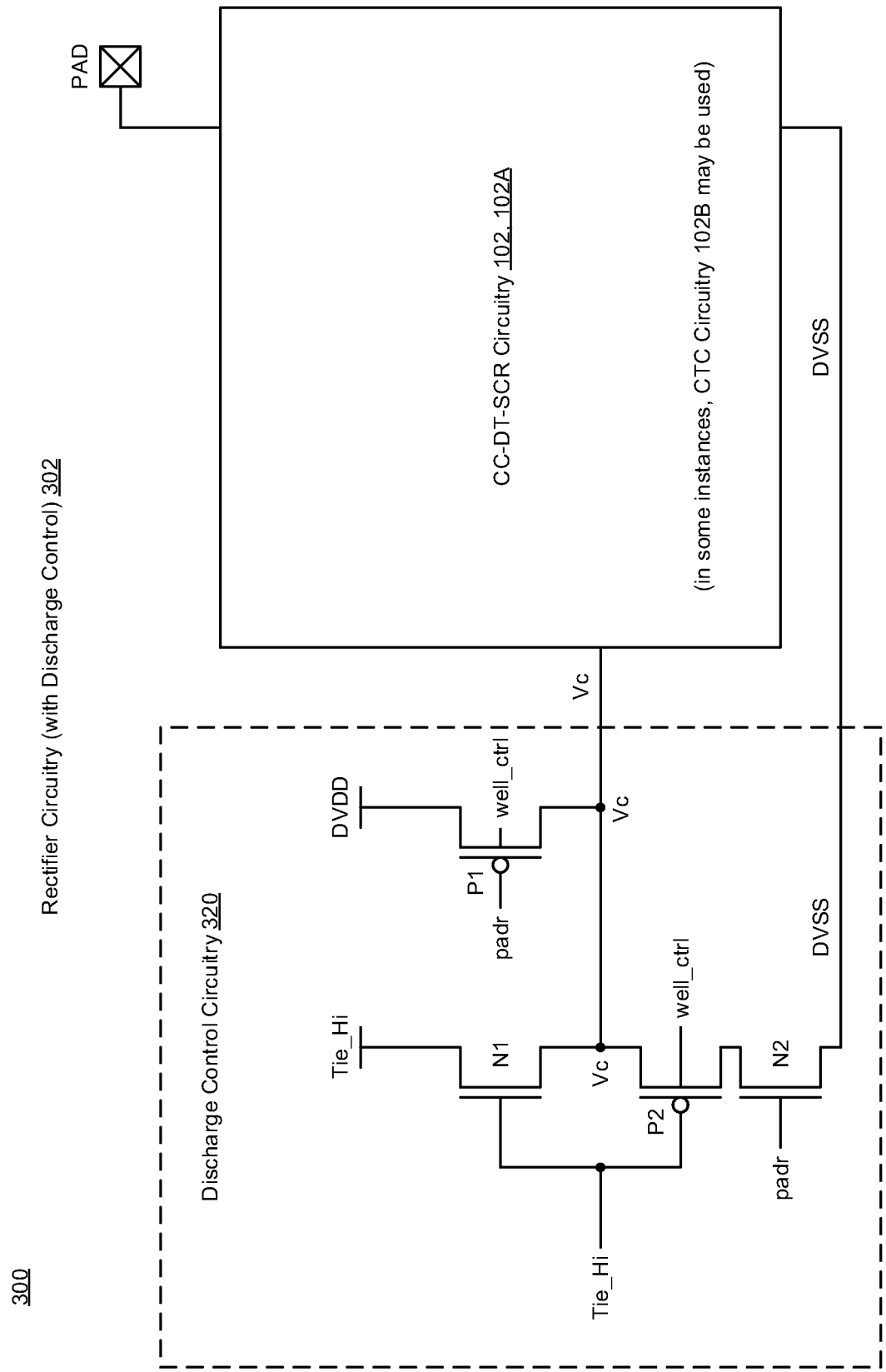
Figure 4:
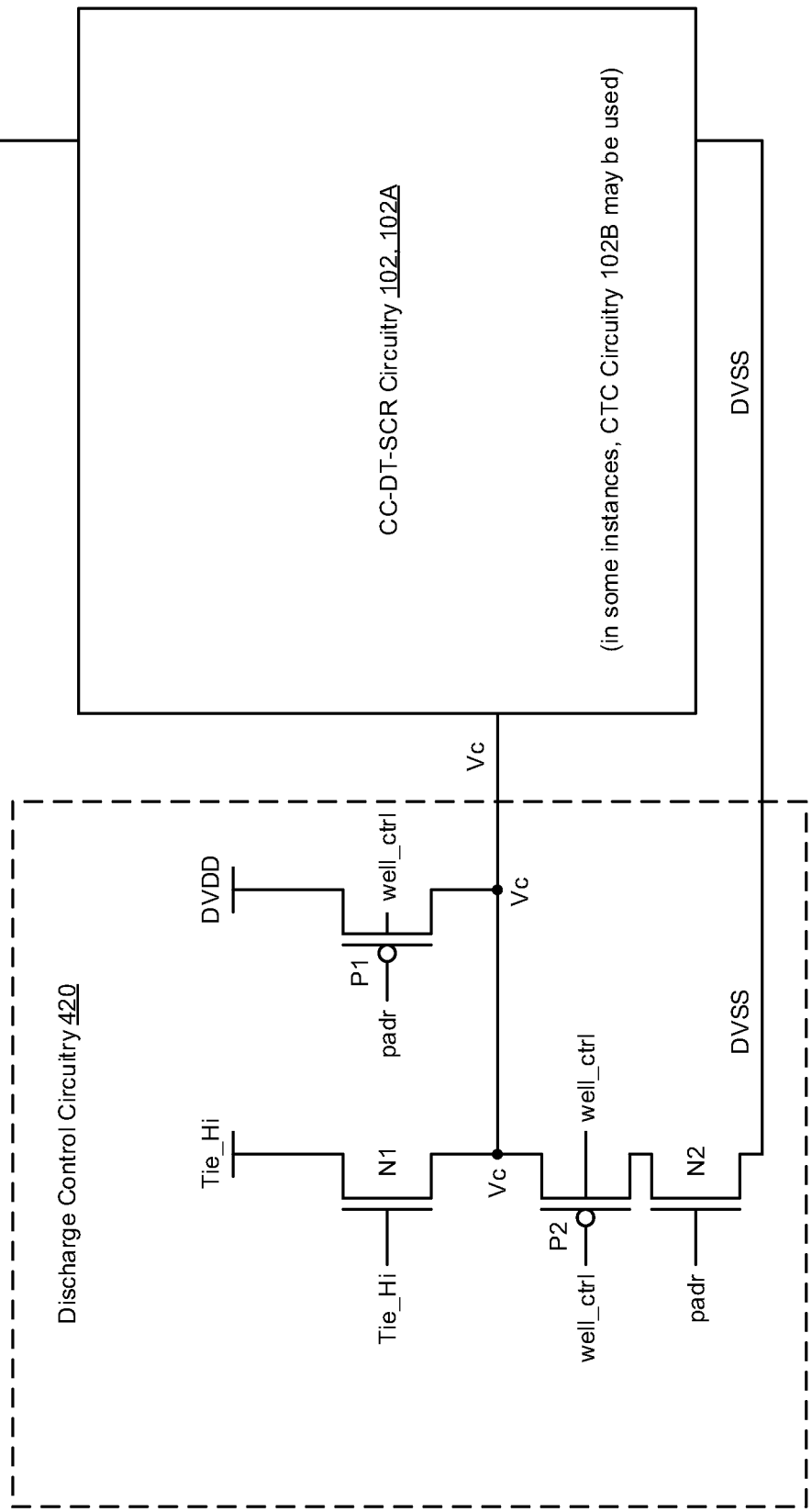

FIGS. 2-4 illustrate various diagrams of rectifier circuitry with discharge control in accordance with some implementations described herein. In particular, FIG. 2 shows a diagram 200 of rectifier circuitry 202 with discharge control circuitry 220, FIG. 3 shows a diagram 300 of rectifier circuitry 302 with discharge control circuitry 320, and FIG. 4 shows a diagram 400 of rectifier circuitry 402 with discharge control circuitry 420. In some instances, the rectifier circuitry 202, 302, 402 of FIGS. 2-4 may include the CC-DT-SCR circuitry 102A along with various components having similar scope, features, behaviors and characteristics as previously described herein above in FIG. 1A. In other instances, the CTC circuitry 102B of FIG. 1B may be used in the rectifier circuitry 202, 302, 402 of FIGS. 2-4 for ESD protection during ESD events.

For instance, as shown in FIG. 2, the rectifier circuitry 202 may include the CC-DT-SCR circuitry 102 having a first stage and a second stage, wherein the first stage has a rectifier that provides a rectified voltage when triggered, and the second stage has diodes and a capacitor that trigger the rectifier by pulling the diodes and capacitor current from the rectifier. Also, as shown in FIG. 2, the rectifier circuitry 202 may include the discharge control circuitry 220 as a third stage that biases the capacitor (in CC-DT-SCR 102) under standard operating conditions and discharging stored charge in power off mode and in between multiple electro-static discharge (ESD). As described herein, the rectifier (in CC-DT-SCR 102) receives the pad voltage from the pad (PAD) and provides the rectified voltage when triggered by the diodes (in CC-DT-SCR 102). The rectifier (in CC-DT-SCR 102) may refer to any type of current-triggered clamping circuit, and also, the diodes are coupled in series between the rectifier and the capacitor, which is coupled between the diodes and ground.

In some instances, the first stage is coupled to the second stage, and the third stage is coupled in parallel with the capacitor. The third stage is configured to operate as the discharge control circuit 220, which biases the capacitor under standard operating conditions and discharging stored charge in power off mode and in between multiple electro-static discharge (ESD). In reference the third stage, the discharge control circuit 220 may have various logic circuits including a first inverter (Inv1) and a second inverter (Inv2) that are configured to provide the control voltage (Vc) that may be used to bias the capacitor (in CC-DT-SCR 102) during electro-static discharge (ESD) at DVDD level during standard operating conditions and/or at zero level in power off mode and in between multiple electro-static discharge (ESD). As shown in FIG. 2, the first inverter (Inv1) includes transistors (P1, N1) coupled in series between a voltage supply (DVDD) and ground (DVSS) at node (n4), and the second inverter (Inv2) includes transistors (P2, N2) coupled in series between a pad voltage (padr) and ground (DVSS) at node (n4). Also, gates of transistors (P1, N1) of the first inverter (Inv1) are coupled to an output (Out_1) of the second inverter (Inv2), and the control voltage (Vc) is taken from an output of the first inverter (Inv1) at a node disposed between transistors (P1, N1). Also, gates of transistors (P2, N2) of the second inverter (Inv2) may be coupled to a Tie-Hi input (e.g., logic 1 taken from the power supply) of the second inverter (Inv2), and an output voltage (Out_1) is taken from the output of the second inverter (Inv2) at a node disposed between transistors (P2, N2).

In some implementations, transistors (P1, P2) may refer to p-type metal-oxide-semiconductor (PMOS) transistors, and transistors (N1, N2) may refer to n-type MOS (NMOS) transistors. However, in other implementations, various other types of transistor configurations may be used to provide similar functionality.

As described herein, the rectifier circuitry 102 may be configured to operate as a triggered rectifier (CC-DT-SCR) having a first stage with an SCR that provides a rectified voltage when triggered. The rectifier circuitry 102 includes a second stage having diodes (DT) and a coupling capacitor (CC) that trigger the SCR by pulling the diode and capacitor current from the SCR. In FIG. 2, the rectifier circuitry 202 includes the discharge control circuitry 220 as a third stage that biases the coupling capacitor (CC) under standard (i.e., normal) operating conditions and discharges stored charge during ESD.

In some implementations, the third stage may have a different configuration for discharge control. For instance, as shown in FIG. 3, the rectifier circuitry 302 may have the third stage that is configured to operate with discharge control circuitry 320 for biasing the coupling capacitor (CC) of 102 during ESD at DVDD level during standard operating conditions and/or at zero level during ESD and power off mode. In some instances, zero level may refer to ground (i.e., DVSS). In reference the third stage, the discharge control circuit 320 may have various logic circuits and logic structures including transistor (P1) and transistors (N1, P2, N2) that are arranged and configured to provide the control voltage (Vc), which is used to bias the coupling capacitor (in CC-DT-SCR 102) and discharge any stored charge during ESD. As shown in FIG. 3, the transistor (P1) may be coupled between the voltage supply (DVDD) and the Vc node, and transistors (N1, P2, N2) may be coupled in series between the Tie-Hi voltage and ground (DVSS). Also, gates of transistors (P1, N2) may be coupled to the pad voltage (padr), and gates of transistors (N1, P2) may be coupled to the Tie-Hi voltage. The control voltage (Vc) is taken from an output node disposed between transistors (N1, P2), and a well control voltage (well_ctrl) may be applied to the bulk terminal of transistor (P2).

In some implementations, transistors (P1, P2) may refer to p-type metal-oxide-semiconductor (PMOS) transistors, and transistors (N1, N2) may refer to n-type MOS (NMOS) transistors. However, in other implementations, various other types of transistor configurations may be used to provide similar functionality.

As described herein, the rectifier circuitry 102 may be configured to operate as a triggered rectifier (CC-DT-SCR) having a first stage with an SCR that provides a rectified voltage when triggered. The rectifier circuitry 102 includes a second stage having diodes (DT) and a coupling capacitor (CC) that trigger the SCR by pulling the diode and capacitor current from the SCR. In FIG. 3, the rectifier circuitry 302 includes the discharge control circuitry 320 as a third stage that biases the coupling capacitor (CC) at DVDD level under standard (i.e., normal) operating conditions and discharges stored charge at zero level (e.g., DVSS) during ESD. In various implementations, zero level may refer to zero volts (0V) at ground level, such as, e.g., DVSS level.

In some implementations, as shown in FIG. 4, the rectifier circuitry 402 may have the third stage with a different configuration for discharge control. For instance, the rectifier circuitry 402 may have the third stage that is configured to operate with discharge control circuitry 420 for biasing the coupling capacitor (CC) of 102 at DVDD level during standard operating conditions and at zero level (DVSS level) during ESD.

In reference the third stage in FIG. 4, the discharge control circuit 420 may have various logic circuits and logic structures including transistors (P1, N1, P2, N2) that are arranged and configured to provide the control voltage (Vc), which is used to bias the coupling capacitor (in CC-DT-SCR 102). As shown in FIG. 4, the transistor (P1) is coupled between the voltage supply (DVDD) and the Vc node, and transistors (N1, P2, N2) are coupled in series between the Tie-Hi voltage (DVDD level) and ground (DVSS). Also, gates of transistors (P1, N2) are coupled to the pad voltage level (padr), the gate of transistor (N1) is coupled to the Tie-Hi voltage, and the gate of transistor (P2) is coupled to the well control voltage (well_ctrl) as being the highest voltage level between DVDD or padr. As shown in FIG. 4, the control voltage (Vc) is taken from an output node disposed between transistors (N1, P2), and also, the well control voltage (well_ctrl) is applied to the bulk terminal of transistor (P2).

In some implementations, transistors (P1, P2) may refer to p-type metal-oxide-semiconductor (PMOS) transistors, and transistors (N1, N2) may refer to n-type MOS (NMOS) transistors. However, in other implementations, various other types of transistor configurations may be used to provide similar functionality.

As described herein, the rectifier circuitry 102 may be configured to operate as a triggered rectifier (CC-DT-SCR) having a first stage with an SCR that provides a rectified voltage when triggered. The rectifier circuitry 102 includes a second stage having diodes (DT) and a coupling capacitor (CC) that trigger the SCR by pulling the diode and capacitor current from the SCR. In FIG. 4, the rectifier circuitry 402 includes the discharge control circuitry 420 as a third stage that biases the coupling capacitor (CC) under standard (i.e., normal) operating conditions and discharges stored charge during ESD.

Figure 5:
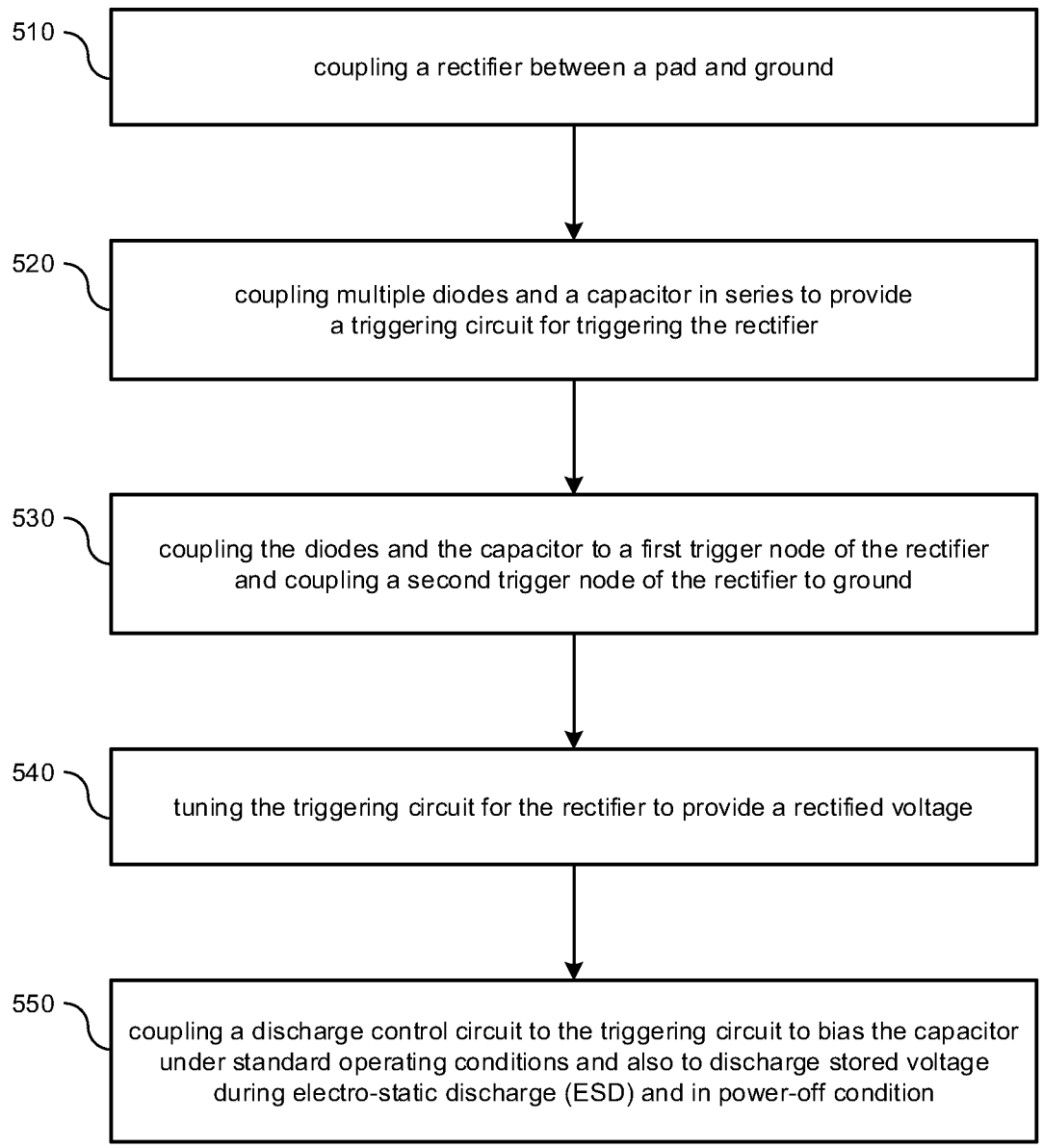
FIG. 5 illustrates a process flow diagram of a method for providing rectifier triggering circuitry in accordance with various implementations described herein.

FIG. 5 illustrates a process diagram of a method 500 for providing rectifier triggering circuitry in accordance with various implementations described herein.

It should be understood that even though method 500 indicates a particular order of operation execution, in some cases, various certain portions of the operations may be executed in a different order, and on different systems. In other cases, additional operations and/or steps may be added to and/or omitted from method 500. Also, method 500 may refer to a method of designing, providing, building and/or manufacturing various rectifier triggering circuitry as an integrated system, device and/or circuit that may involve use of the various IC circuit components described herein so as to thereby implement rectifier triggering schemes and techniques associated therewith.

In some implementations, method 500 and related rectifier triggering circuitry may be used to improve ESD protection with an improved triggering circuit, which offers lower triggering voltage under ESD, while keeping a high immunity for false triggering by having a higher triggering voltage when IC power is ON.

At block 510, method 500 may couple a rectifier (or a thyristor) between a pad and ground, such as, e.g., DVSS. The rectifier (or thyristor) is exposed to a pad voltage provided at the pad. In various instances, the rectifier may be implemented with any type of clamping circuit or similar type of switching circuit that is controlled through a triggering current for functioning as a self-sustained latched clamp. For instance, in some cases, the switching circuit refers to use of a silicon-controlled rectifier (SCR).

At block 520, method 500 may couple multiple diodes and a capacitor in series to provide a triggering circuit for triggering the rectifier. At block 530, method 500 may couple a circuit branch formed of the multiple diodes and the capacitor to a first trigger node of the rectifier, and method 500 may couple a second trigger node of the rectifier to ground (e.g., DVSS). In some instances, the diodes and capacitor are coupled in series between the rectifier and ground (e.g., DVSS), and also, the capacitor may be referred to as a coupling capacitor that is coupled between the diodes and ground (e.g., DVSS). In various implementations, the rectifier may include one or more BJTs that are triggered by the series-coupled diodes and capacitor, and also, the one or more BJTs may include one or more PNP based BJTs and/or one or more NPN based BJTs.

At block 540, method 500 may tune the triggering circuit (i.e., the diodes and the capacitor) for the rectifier to provide a rectified voltage. Also, at block 550, method 500 may couple a discharge control circuit to the triggering circuit (e.g., to a node disposed between the diodes and capacitor) so as to bias the capacitor under standard operating conditions and also to discharge stored voltage during electrostatic discharge (ESD) and in power-off condition. In some implementations, the discharge control circuitry may be referred to as a capacitor charge control circuit.

In some instances, the rectifier may include a first BJT with a PNP structure, and the rectifier may also include a second BJT with an NPN structure. In this instance, the trigger node may refer to a base terminal (B) of the PNP structure at a first node (e.g., n1), and the internal net may refer to a base terminal (B) of the NPN structure at a second node (e.g., n2). In some instances, method 500 may couple a first resistor (or first resistor net) between the diodes and the rectifier, and method 500 may couple a second resistor (or second resistor net) between the rectifier and ground (e.g., DVSS). In some instances, the one or more resistors (or resistor nets) may refer to native or intrinsic resistors built-in within the rectifier structure, such as, e.g., as parasitic well-resistors for access to parasitic BJT device terminals to form a thyristor structure, which is referred to as an SCR. Also, in some instances, the capacitance value of the capacitor may be tuned and/or modified based on the size and desired triggering characteristics and/or behavior of the rectifier.

In various implementations as described herein, use of CC-DT-SCR circuitry along with discharge control has some advantages. For instance, FIGS. 2-3 provide for bypassing the coupling capacitor (CC/C1) under ESD, which makes the CC-DT-SCR still with no charge on Vc to keep the same ESD performance even for multiple successive ESD zaps. Also, FIGS. 1A and 4 provide for user flexibility with respect to altering (or modifying) capacitor size and diode string number to meet a desired ESD triggering threshold. The Vc biasing circuit (i.e., the charge control circuit) may assist with reducing the ESD triggering voltage by discharging the coupling capacitor (CC/C1) in case of repetitive and cumulative zaps (i.e., ESD qualification tests). The Vc biasing circuit (i.e., the charge control circuit) may also be used to bias the coupling capacitor (CC/C1) to DVDD under normal operating conditions (power ON) to reduce the false triggering under noise or latch-up (LU) injection. Triggering prevention under system-level ESD may be improved by Vc biasing to DVDD, and also, the CC-DT-SCR may be used for ESD protection in both signals and voltage reference pins.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include switching circuitry that provides a rectified voltage when triggered. The device may include diode circuitry coupled in series with charge storage circuitry, and the diode circuitry and the charge storage circuitry operate to trigger the switching circuitry.

Described herein are various implementations of a triggered rectifier. The triggered rectifier may include a first stage having a rectifier that provides a rectified voltage when triggered. The triggered rectifier may include a second stage having diodes and a capacitor that trigger the rectifier by pulling the diodes and capacitor current from the rectifier. The triggered rectifier may include a third stage that biases the capacitor under standard operating conditions and discharges stored charge during electro-static discharge (ESD) and unpowered conditions (e.g., during power off mode).

Described herein are various implementations of a method. The method may include coupling a rectifier between a pad and ground. The method may include coupling multiple diodes and a capacitor in series. The method may include coupling the diodes and the capacitor to the rectifier. The method may also include triggering the rectifier to provide a rectified voltage.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   switching circuitry coupled to a pad with a single path, wherein the switching circuitry includes at least one transistor, and wherein the switching circuitry provides a rectified voltage when triggered;
   diode circuitry coupled in series with charge storage circuitry, wherein the diode circuitry is coupled between a gate of the at least one transistor and the charge storage circuitry, and wherein the diode circuitry and the charge storage circuitry operate to trigger the switching circuitry; and
   control circuitry coupled to a node disposed between the diode circuitry and the charge storage circuitry, wherein the control circuitry biases the charge storage circuitry with a control voltage.

2. The device of claim 1, wherein the device refers to a rectifier or a thyristor that is configured to provide for electro-static discharge (ESD) protection.

3. The device of claim 1, wherein the switching circuitry is exposed to a pad voltage at the pad and, wherein the switching circuitry limits voltage applied to the rectified voltage when triggered by the diode circuitry.

4. The device of claim 1, wherein the switching circuitry is a silicon controlled rectifier (SCR) having bipolar junction transistors (BJT) including the at least one transistor as at least one BJT.

5. The device of claim 4, wherein the bipolar junction transistors (BJT) include a first BJT and a second BJT, and wherein the first BJT refers to the at least one transistor as a PNP based BJT, and wherein the second BJT refers to an NPN based BJT.

6. The device of claim 5, wherein the NPN based BJT is coupled between a base terminal of the PNP based BJT and ground.

7. The device of claim 1, wherein the switching circuitry is configured to operate as a current-triggered clamp that provides electro-static discharge (ESD) protection.

8. The device of claim 1, wherein the diode circuitry has multiple diodes coupled in series between a triggering signal net of the switching circuitry and the charge storage circuitry.

9. The device of claim 1, wherein the charge storage circuitry has a coupling capacitor that is coupled between the diode circuitry and ground.

10. The device of claim 1, wherein:
the control circuitry refers to discharge control circuitry that is configured to bias the charge storage circuitry with the control voltage under standard operating conditions and discharge a stored voltage during electro-static discharge and during power off mode.

11. A triggered rectifier, comprising:
a first stage having a rectifier that provides a rectified voltage when triggered, wherein the rectifier has at least one transistor;
a second stage having diodes and a capacitor that trigger the rectifier by pulling the diodes and capacitor current from the rectifier, wherein the diodes are coupled between a gate of the at least one transistor and the capacitor; and
a third stage that biases the capacitor under standard operating conditions and discharges stored charge during electro-static discharge (ESD) and during power off mode.

12. The rectifier of claim 11, wherein the rectifier receives a pad voltage and provides the rectified voltage when triggered by the trigger stage.

13. The rectifier of claim 11, wherein the rectifier refers to a current-triggered clamping circuit.

14. The rectifier of claim 11, wherein the diodes are coupled in series between the rectifier and the capacitor, and wherein the capacitor is coupled between the diodes and ground.

15. The rectifier of claim 11, wherein the first stage is coupled to the second stage, and wherein the third stage is coupled to the capacitor, and wherein the third stage operates as a discharge control circuit that biases the capacitor under standard operating conditions and discharge stored charge during electro-static discharge (ESD) and during power off mode.

16. The rectifier of claim 11, wherein the third stage comprises logic circuitry including a first inverter and a second inverter that are configured to provide a control voltage that biases the capacitor under standard operating conditions and discharge stored charge during electro-static discharge (ESD) and during power off mode.

17. The rectifier of claim 11, wherein the third stage comprises multiple logic structures that are arranged and configured to provide a control voltage that biases the capacitor under standard operating conditions and discharge stored charge during electro-static discharge (ESD) and during power off mode.

18. A method, comprising:
coupling a rectifier between a pad and ground, wherein the rectifier is coupled to the pad with a single path, and wherein the rectifier has at least one transistor;
coupling multiple diodes and a capacitor in series;
coupling the multiple diodes and the capacitor to trigger the rectifier, wherein the multiple diodes are coupled between a gate of the at least one transistor and the capacitor;
coupling a control circuitry to a node disposed between the multiple diodes and the capacitor, wherein the control circuitry biases the capacitor with a control voltage; and
triggering the rectifier to provide a rectified voltage.

19. The method of claim 18, further comprising: coupling the multiple diodes and the capacitor to a trigger node of the rectifier, and coupling an internal net of the rectifier to ground.

20. The method of claim 19, wherein:
the rectifier has a first bipolar junction transistor (BJT) with a PNP structure,
the rectifier has a second BJT with an NPN structure,
the trigger node refers to a base terminal of the PNP structure at a first node, and
the internal net refers to a base terminal of the NPN structure at a second node.

* * * * *